(12) United States Patent
Fisher et al.

(10) Patent No.: US 9,246,024 B2
(45) Date of Patent: Jan. 26, 2016

(54) PHOTOVOLTAIC DEVICE WITH ALUMINUM PLATED BACK SURFACE FIELD AND METHOD OF FORMING SAME

(75) Inventors: Kathryn C. Fisher, Brooklyn, NY (US); Qiang Huang, Sleepy Hollow, NY (US); Satyavolu S. Papa Rao, Poughkeepsie, NY (US); Ming-Ling Yeh, Baltimore, MD (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1122 days.

(21) Appl. No.: 13/182,880

(22) Filed: Jul. 14, 2011

(65) Prior Publication Data

US 2013/0014812 A1     Jan. 17, 2013

(51) Int. Cl.
*H01L 31/18*     (2006.01)
*H01L 31/0224*     (2006.01)
*H01L 31/068*     (2012.01)

(52) U.S. Cl.
CPC ...... *H01L 31/022425* (2013.01); *H01L 31/068* (2013.01); *Y02E 10/547* (2013.01)

(58) Field of Classification Search
CPC ............ H01L 31/02008; H01L 31/0203; H01L 31/02167; H01L 31/02168; H01L 31/0232; H01L 31/022425; H01L 31/068
USPC ............. 257/21, 52–56, 431–437, 461–466, 257/E21.211, E31.003, E31.001
See application file for complete search history.

(56) References Cited

U.S. PATENT DOCUMENTS

| | | |
|---|---|---|
| 3,948,736 A | 4/1976 | Russell |
| 3,969,195 A | 7/1976 | Doetzer et al. |
| 4,035,590 A | 7/1977 | Halter |
| 4,044,379 A | 8/1977 | Halter |
| 4,053,383 A | 10/1977 | Doetzer et al. |
| 4,101,386 A | 7/1978 | Doetzer et al. |
| 4,148,204 A | 4/1979 | Doetzer et al. |
| 4,180,442 A | 12/1979 | Byrd |
| 4,240,895 A | 12/1980 | Gray |
| 4,297,436 A | 10/1981 | Kubotera et al. |
| 4,333,215 A | 6/1982 | Swanger |
| 4,338,177 A | 7/1982 | Withers et al. |
| 4,338,215 A | 7/1982 | Shaffer et al. |
| 4,342,637 A | 8/1982 | Withers et al. |
| 4,370,361 A | 1/1983 | Gray |
| 4,394,228 A | 7/1983 | Gray |
| 4,405,427 A | 9/1983 | Byrd |

(Continued)

OTHER PUBLICATIONS

International Search Report and the Written Opinion dated Jul. 27, 2012, received in a corresponding foreign application.

*Primary Examiner* — Cuong Q Nguyen
(74) *Attorney, Agent, or Firm* — Scully, Scott, Murphy & Presser, P.C.; Louis J. Percello, Esq.

(57) ABSTRACT

A photovoltaic device is provided that includes a semiconductor substrate including a p-n junction with a p-type semiconductor portion and an n-type semiconductor portion one on top of the other. A plurality of patterned antireflective coating layers is located on a p-type semiconductor surface of the semiconductor substrate, wherein at least one portion of the p-type semiconductor surface of the semiconductor substrate is exposed. Aluminum is located directly on the at least one portion of the p-type semiconductor surface of the semiconductor substrate that is exposed.

7 Claims, 4 Drawing Sheets

(56) References Cited

U.S. PATENT DOCUMENTS

| | | |
|---|---|---|
| 4,405,434 A | 9/1983 | Gray |
| RE31,410 E | 10/1983 | Gray |
| 4,484,994 A | 11/1984 | Jacobs, III et al. |
| 4,518,457 A | 5/1985 | Gray |
| 4,588,838 A | 5/1986 | Byrd |
| 4,670,110 A | 6/1987 | Withers et al. |
| 4,765,055 A | 8/1988 | Ozaki et al. |
| 4,803,811 A | 2/1989 | Birkle et al. |
| 4,882,237 A | 11/1989 | Koyama |
| 4,904,355 A | 2/1990 | Takahashi |
| 4,963,440 A | 10/1990 | Shimogori et al. |
| 4,999,097 A | 3/1991 | Sadoway |
| 5,310,553 A | 5/1994 | Simon et al. |
| 5,350,644 A | 9/1994 | Graetzel et al. |
| 5,554,458 A | 9/1996 | Noda et al. |
| 5,751,018 A | 5/1998 | Alivisatos et al. |
| 6,197,438 B1 | 3/2001 | Faulkner |
| 6,372,364 B1 | 4/2002 | Hunt et al. |
| 6,458,218 B1 | 10/2002 | Savich |
| 6,565,820 B1 | 5/2003 | Weimer et al. |
| 6,656,606 B1 | 12/2003 | Morin et al. |
| 6,692,630 B2 | 2/2004 | Morin et al. |
| 6,719,948 B2 | 4/2004 | Lorenz et al. |
| 6,863,491 B2 | 3/2005 | Cheng et al. |
| 6,881,321 B2 | 4/2005 | Wu et al. |
| 6,893,549 B2 | 5/2005 | Chou et al. |
| 7,014,739 B2 | 3/2006 | Lin et al. |
| 7,080,545 B2 | 7/2006 | Dimeo, Jr. et al. |
| 7,125,803 B2 | 10/2006 | Chou et al. |
| 7,182,849 B2 | 2/2007 | Shih et al. |
| 7,252,750 B2 | 8/2007 | Liu et al. |
| 7,296,460 B2 | 11/2007 | Dimeo, Jr. et al. |
| 7,336,157 B2 | 2/2008 | Richmond |
| 7,347,920 B2 | 3/2008 | Wu et al. |
| 7,371,467 B2 | 5/2008 | Han et al. |
| 7,390,531 B2 | 6/2008 | Burmeister et al. |
| 7,451,906 B2 | 11/2008 | Dockus et al. |
| 7,475,588 B2 | 1/2009 | Dimeo, Jr. et al. |
| 7,481,910 B2 | 1/2009 | Feng et al. |
| 7,544,281 B2 | 6/2009 | Lin et al. |
| 7,735,718 B2 | 6/2010 | Graham et al. |
| 7,816,694 B2 | 10/2010 | Chao et al. |
| 7,833,401 B2 | 11/2010 | Han et al. |
| 8,569,100 B2 * | 10/2013 | Hama et al. .............. 438/72 |
| 2005/0268963 A1 | 12/2005 | Jordan et al. |
| 2009/0223549 A1 | 9/2009 | Ounadjela et al. |
| 2010/0075261 A1 | 3/2010 | Clevenger et al. |
| 2010/0108130 A1 * | 5/2010 | Ravi .................. 257/E31.003 |
| 2010/0193016 A1 | 8/2010 | Fernandez et al. |
| 2011/0105637 A1 * | 5/2011 | Fujita et al. .................. 522/120 |
| 2011/0114147 A1 * | 5/2011 | Zaks et al. ............ 257/E21.211 |
| 2011/0237016 A1 * | 9/2011 | Nishimoto ............ 257/E31.001 |
| 2012/0305071 A1 * | 12/2012 | Afseth et al. ................. 136/256 |

\* cited by examiner

PHOTOVOLTAIC DEVICE WITH ALUMINUM PLATED BACK SURFACE FIELD AND METHOD OF FORMING SAME

BACKGROUND

The present disclosure relates to a photovoltaic device and photovoltaic device manufacturing. More particularly, the present disclosure provides a photovoltaic device with an aluminum electroplated back side surface field and a method of forming the same.

A photovoltaic device is a device that converts the energy of incident photons to electromotive force (e.m.f.). Typical photovoltaic devices include solar cells, which are configured to convert the energy in the electromagnetic radiation from the Sun to electric energy. Each photon has an energy given by the formula E=hv, in which the energy E is equal to the product of the Plank constant h and the frequency v of the electromagnetic radiation associated with the photon.

A photon having energy greater than the electron binding energy of a matter can interact with the matter and free an electron from the matter. While the probability of interaction of each photon with each atom is probabilistic, a structure can be built with a sufficient thickness to cause interaction of photons with the structure with high probability. When an electron is knocked off an atom by a photon, the energy of the photon is converted to electrostatic energy and kinetic energy of the electron, the atom, and/or the crystal lattice including the atom. The electron does not need to have sufficient energy to escape the ionized atom. In the case of a material having a band structure, the electron can merely make a transition to a different band in order to absorb the energy from the photon.

The positive charge of the ionized atom can remain localized on the ionized atom, or can be shared in the lattice including the atom. When the positive charge is shared by the entire lattice, thereby becoming a non-localized charge, this charge is described as a hole in a valence band of the lattice including the atom. Likewise, the electron can be non-localized and shared by all atoms in the lattice. This situation occurs in a semiconductor material, and is referred to as photogeneration of an electron-hole pair. The formation of electron-hole pairs and the efficiency of photogeneration depend on the band structure of the irradiated material and the energy of the photon. In case the irradiated material is a semiconductor material, photogeneration occurs when the energy of a photon exceeds the band gap energy, i.e., the energy difference of the conduction band and valence band.

The direction of travel of charged particles, i.e., the electrons and holes, in an irradiated material is sufficiently random (known as carrier "diffusion"). Thus, in the absence of an electric field, photogeneration of electron-hole pairs merely results in heating of the irradiated material. However, an electric field can break the spatial direction of the travel of the charged particles to harness the electrons and holes formed by photogeneration.

One exemplary method of providing an electric field is to form a p-n or p-i-n junction around the irradiated material. Due to the higher potential energy of electrons (corresponding to the lower potential energy of holes) in the p-doped material with respect to the n-doped material, electrons and holes generated in the vicinity of the p-n junction will drift to the n-doped and p-doped region, respectively. Thus, the electron-hole pairs are collected systematically to provide positive charges at the p-doped region and negative charges at the n-doped region. The p-n or p-i-n junction forms the core of this type of photovoltaic device, which provides electromotive force that can power a device connected to the positive node at the p-doped region and the negative node at the n-doped region.

The photon generated electrons and holes are to be collected at the n-type and p-type semiconductor materials, respectively. However, the number of carriers can decrease significantly because they recombine with each other before they get collected. This recombination becomes more pronounced when there are more recombination centers, i.e., locations where the recombination is more likely to occur. One of main recombination is surface recombination, which occurs at the semiconductor surface.

In order to improve the performance of a solar cell, surface recombination needs to be suppressed. One way of doing that is to prevent the carrier to reach the surface. For example, aluminum was used in silicon solar cells to form a highly doped p-type Si layer at the surface of a p-type Si substrate. This highly doped p-type Si layer creates an electrical field, commonly called a back surface field (BSF), which repels the electrons at the vicinity of this layer, and thus limits the surface recombination. A better way of suppressing surface recombination is to use a layer of material to change the semiconductor surface behavior, so called passivation, and to suppress the recombination even if the carriers reach the surface. A commonly used example is silicon nitride on Si solar cells.

The majority of solar cells currently in production are based on silicon wafers. The surface recombination on the n-type Si was improved by using a silicon nitride passivation layer, and on the p-type Si by using a screen printed blanket film of aluminum to form the BSF. In addition, the printed aluminum also acts as the electrical contact to the p-type Si. The electrical contact to the n-type Si was formed through the nitride passivation layer by methods such as screen printing Ag.

Screen printing is attractive due to its simplicity in processing and high throughput capability; however, the high contact resistance, high paste cost, shadowing from wide conductive lines, high temperature processing, and mechanical yield loss are disadvantages that have not been overcome even after thirty plus years of research and development.

Furthermore, because a nitride passivation layer better suppresses the surface recombination than a BSF, a local aluminum BSF contact with most of Si surface passivated by silicon nitride is needed. However, direct screen printing of patterned aluminum through silicon nitride is not available. Local deposition of aluminum directly on p-type Si and the local formation of BSF in a silicon nitride pattern are highly desired.

For advanced and experimental high efficiency solar cells, vacuum based metallization processes are used to avoid the disadvantages of screen printing. The high cost and low throughput of vacuum processes prohibit the implementation of these processes in single emitter solar cells, the majority in the current photovoltaic industry.

SUMMARY

In one embodiment of the present disclosure, a photovoltaic device is provided in which aluminum is electroplated directly on exposed portions of a p-type semiconductor surface of a semiconductor substrate. Specifically, the photovoltaic device of the present disclosure includes a semiconductor substrate including a p-n junction with a p-type semiconductor portion and an n-type semiconductor portion one on top of the other. A plurality of patterned antireflective coating layers is located on a p-type semiconductor surface of the semiconductor substrate, wherein at least one portion of the p-type semiconductor surface of the semiconductor substrate is exposed. Aluminum is located directly on the at least one portion of the p-type semiconductor surface of the semiconductor substrate that is exposed.

In another embodiment of the present disclosure, a method is provided in which aluminum is electroplated directly on exposed portions of a back side surface of a semiconductor substrate. Specifically, the method of the present disclosure includes providing a semiconductor substrate including a p-n junction with a p-type semiconductor portion and an n-type semiconductor portion one on top of the other. A plurality of patterned antireflective coating layers is formed on a p-type semiconductor surface of the semiconductor substrate, wherein at least one portion of the p-type semiconductor surface of the semiconductor substrate is exposed. Aluminum is directly electrodeposited on the at least one portion of the p-type semiconductor surface of the semiconductor substrate that is exposed.

DETAILED DESCRIPTION

The present disclosure, which provides a photovoltaic device with an aluminum electroplated back side surface field and a method of forming the same, will now be described in greater detail by referring to the following discussion and drawings that accompany the present application. It is observed that the drawings of the present application are provided for illustrative proposes and, as such, the drawings are not drawn to scale.

In the following description, numerous specific details are set forth, such as particular structures, components, materials, dimensions, processing steps and techniques, in order to provide an understanding of some aspects of the present disclosure. However, it will be appreciated by one of ordinary skill in the art that the present disclosure may be practiced without these specific details. In other instances, well-known structures or processing steps have not been described in detail in order to avoid obscuring the embodiments of the present disclosure described herein.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
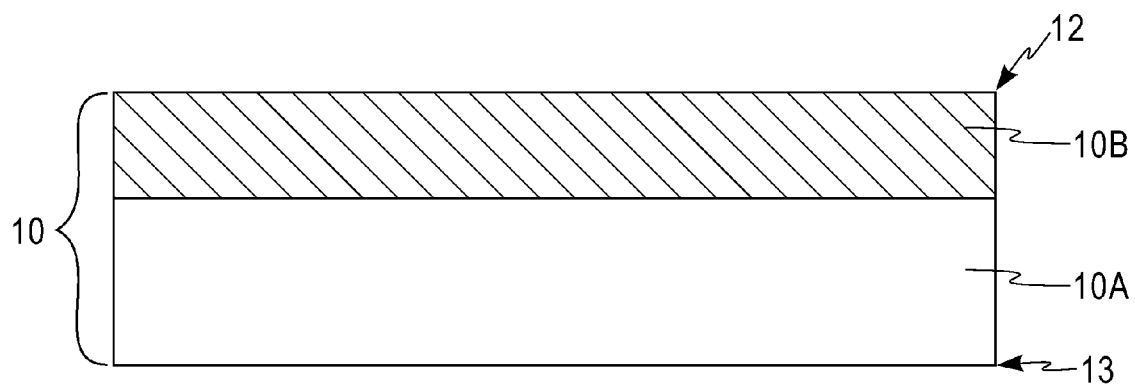
FIG. 1 is a pictorial representation (through a cross sectional view) illustrating an initial structure including a semiconductor substrate having an n-type semiconductor surface and a p-type semiconductor surface that can be employed in one embodiment of the present disclosure.

Referring now to FIG. 1, there is illustrated an initial structure that can be employed in one embodiment of the present disclosure. The initial structure includes a semiconductor substrate 10 having an n-type semiconductor surface 12 and a p-type semiconductor surface 13 that is opposite the n-type semiconductor surface 12. The n-type semiconductor surface 12 is the front side surface in the illustration, but it can also be the back side surface. The p-type semiconductor surface 13 is the back side surface in the illustration, but it can also be the front side surface.

The semiconductor substrate 10 can comprise any semiconductor material including, but not limited to, Si, Ge, SiGe, SiC, SiGeC, GaAs, GaN, InAs, InP, CdTe, CuInSe$_2$, Cu(In-Ga)Se$_2$, and all other III/V, II/VI, or I/III/VI compound semiconductors. In one embodiment of the present disclosure, the semiconductor substrate 10 is comprised of Si. In another embodiment, the semiconductor substrate 10 is comprised of a single crystalline semiconductor material. In another embodiment, the semiconductor substrate 10 is comprised of a multicrystalline semiconductor material. In yet another embodiment, the semiconductor substrate 10 is comprised of multiple layers of different semiconductor materials, for example, with different energy band gaps.

The semiconductor substrate 10 illustrated in FIG. 1 includes a p-type semiconductor portion 10A that includes a p-type dopant, and an n-type semiconductor portion 10B that includes an n-type dopant. In FIG. 1, the n-type semiconductor portion 10B overlies the p-type semiconductor portion 10A. In some embodiments (not shown), the p-type semiconductor portion of the substrate overlies the n-type semiconductor portion. In such an embodiment, the order of layers 10A and 10B would be reversed from that shown, i.e., layer 10A would be located atop layer 10B. Also, in such an embodiment, an exposed surface of layer 10A would be used as the front side surface of the semiconductor substrate 10, while an exposed surface of layer 10B would be used as the back side surface of the semiconductor substrate.

The term "n-type dopant" is used throughout the present disclosure to denote an atom from Group VA of the Periodic Table of Elements including, for example, P, As and/or Sb. The term "p-type dopant" is used throughout the present disclosure to denote an atom from Group IIIA of the Periodic Table of Elements including, for example, B, Al, Ga and/or In.

The concentration of dopant within the semiconductor material may vary depending on the ultimate end use of the semiconductor material and the type of dopant atom being employed. The p-type semiconductor portion 10A of the semiconductor substrate 10 typically has a p-type dopant concentration from 1e15 atoms/cm$^3$ to 1e17 atoms/cm$^3$, with a p-type dopant concentration from 5e15 atoms/cm$^3$ to 5e16 atoms/cm$^3$ being more typical. The n-type semiconductor portion 10B of the semiconductor substrate 10 typically has an n-type dopant concentration from 1e16 atoms/cm$^3$ to 1e22 atoms/cm$^3$, with an n-type dopant concentration from 1e19 atoms/cm$^3$ to 1e21 atoms/cm$^3$ being more typical. The sheet resistance of the n-type semiconductor portion 10B is typically greater than 50 ohm/sq, with a sheet resistance range of the n-type semiconductor portion 10B from 60 ohm/sq to 200 ohm/sq being more typical.

The dopant (n-type and/or p-type) can be introduced into an initial doped or undoped semiconductor material using techniques well known to those skilled. For example, the n-type and/or p-type dopant can be introduced into the semiconductor material by ion implantation, gas phase doping, liquid solution spray/mist doping, and/or out-diffusion of a dopant atom from an overlying sacrificial dopant material layer that can be formed on the substrate, and removed after the out-diffusion process. In some embodiments of the present disclosure, the dopant(s) can be introduced into the semiconductor substrate 10 during the formation thereof. For example, an in-situ epitaxial growth process can be used to form a doped semiconductor substrate 10.

The front side surface of the semiconductor substrate 10 may be non-textured or textured. Although the drawing and description illustrates the case where the front side of the substrate 10 is the n-type of semiconductor, it can also be p-type semiconductor. Therefore, either the n-type semiconductor surface or p-type semiconductor surface can be textured, whichever one is at the front side. For illustration purpose, the front side surface is the n-type semiconductor and the back side surface is the p-type semiconductor. A textured (i.e., specially roughened) surface is used in solar cell applications to increase the efficiency of light absorption. The textured surface decreases the fraction of incident light lost to reflection relative to the fraction of incident light transmitted into the cell since photons incident on the side of an angled feature will be reflected onto the sides of adjacent angled features and thus have another chance to be absorbed. Moreover, the textured surface increases internal absorption, since light incident on an angled semiconductor surface will typically be deflected to propagate through the substrate at an oblique angle, thereby increasing the length of the path taken to reach the substrate's back surface, as well as making it more likely that photons reflected from the substrate back surface will impinge on the front surface at angles compatible with total internal reflection and light trapping. The texturing of the n-type semiconductor surface 12 of the semiconductor substrate 10 can be performed utilizing conventional techniques well known in the art. In one embodiment, a KOH based solution can be used to texture the n-type semiconductor surface 12 of a single crystalline silicon semiconductor substrate. In another embodiment, a HNO$_3$/HF solution can be used to texture a multicrystalline silicon wafer surface. In yet another embodiment, texturing can be achieved by utilizing a combination of reactive ion etching (RIE) and a mask comprising closely packed self-assembled polymer spheres.

Figure 2:
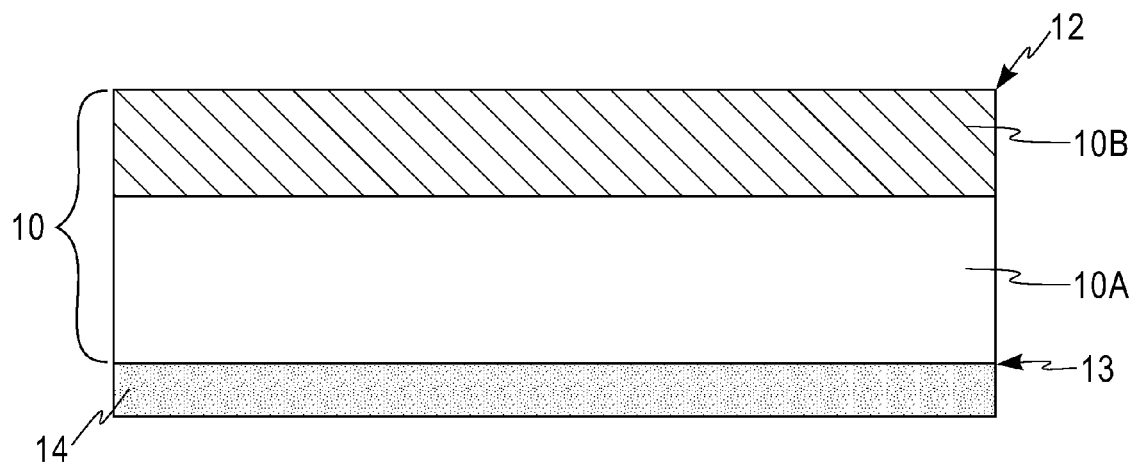
FIG. 2 is a pictorial representation (through a cross sectional view) illustrating the initial structure of FIG. 1 after forming a blanket layer of an antireflective coating on the p-type semiconductor surface of the semiconductor substrate.

Referring now to FIG. 2, there is illustrated the structure of FIG. 1 after forming a blanket layer of an antireflective coating (ARC) 14 on the p-type semiconductor surface 13 of semiconductor substrate 10. The blanket layer of ARC 14 that can be employed in the present disclosure includes a conventional ARC material such as, for example, an inorganic ARC or an organic ARC. In one embodiment of the present disclosure, the ARC material comprises silicon nitride. The blanket layer of ARC 14 can be formed utilizing techniques well known to those skilled in the art. For example, an ARC composition can be applied to the p-type semiconductor surface 13 of the semiconductor substrate 10 (i.e., directly onto the exposed surface of the p-type semiconductor portion 10A in the embodiment illustrated in the drawings) utilizing a conventional deposition process including, for example, spin-on coating, dip coating, evaporation, chemical solution deposition, chemical vapor deposition (CVD), and plasma enhanced chemical vapor deposition (PECVD). After application of the ARC composition, particularly those from a liquid phase, a post deposition baking step is usually employed to remove unwanted components, such as solvent, and to effect crosslinking. The post deposition baking step of the ARC composition is typically, but not necessarily always, performed at a temperature from 80° C. to 300° C., with a baking temperature from 120° C. to 200° C. being more typical.

In some embodiments, the as-deposited ARC composition may be subjected to a post deposition treatment to improve the properties of the entire layer or the surface of the ARC. This post deposition treatment can be selected from heat treatment, irradiation of electromagnetic wave (such as ultraviolet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise.

Figure 3:
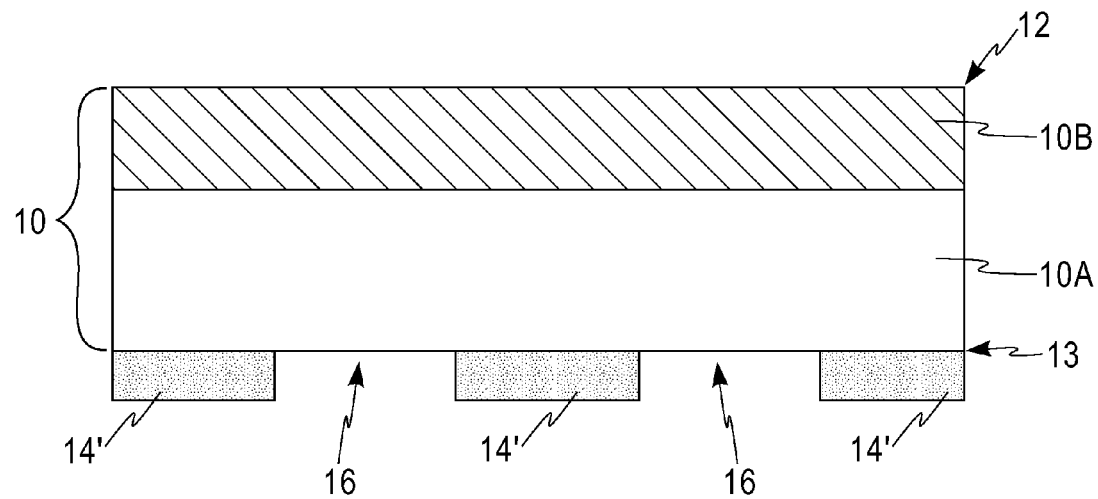
FIG. 3 is a pictorial representation (through a cross sectional view) illustrating the structure of FIG. 2 after patterning the blanket layer of the antireflective coating to expose at least one portion of the p-type semiconductor surface of the semiconductor substrate.

Referring now to FIG. 3, there is illustrated the structure of FIG. 2 after patterning the blanket layer of ARC 14 forming a plurality of patterned antireflective coatings (ARCs) 14' having an opened pattern 16 located therein that exposes portions of the p-type semiconductor surface 13 of semiconductor substrate 10. Typically, the opened pattern 16 is in the form of a grid pattern. Alternatively, the opened pattern can also be discontinuously distributed patterns such as dots, pads and lines. Although the cross sectional drawings show the presence of two openings formed into the blanket layer of ARC 14, one or a plurality of such openings can be formed providing a grid pattern to the back side surface 13 of the semiconductor substrate 10. In one embodiment, the plurality of patterned ARCs 14' can be formed by lithography and etching. The lithographic process includes applying a photoresist (not shown) to an upper surface of the blanket layer of ARC 14, exposing the photoresist to a desired pattern of radiation and developing the exposed photoresist utilizing a conventional resist developer. A patterned photoresist is thus provided. The pattern in the photoresist is transferred to the blanket layer of ARC 14 utilizing an etching process such as, for example, dry etching or chemical wet etching. After transferring the pattern from the patterned photoresist to the underlying blanket layer of ARC 14, the patterned photoresist is typically removed from the structure utilizing a conventional resist stripping process such as, for example, ashing. In another embodiment, the blanket layer of ARC 14 can be patterned utilizing ink jet printing or laser ablation. In yet another embodiment, the exposed portions of the p-type semiconductor surface 13 in the opened pattern 16 can be further treated to increase the doping level. In these cases, the bottom semiconductor material portion can be thicker or can have higher dopant concentration in the region defined by the opened pattern 16.

Figure 4:
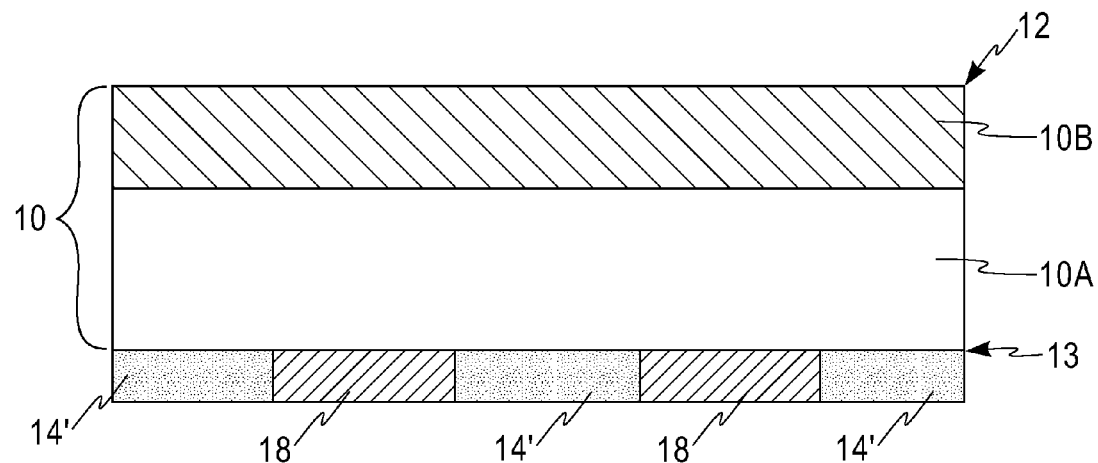
FIG. 4 is a pictorial representation (through a cross sectional view) illustrating the structure of FIG. 3 after forming aluminum directly on the exposed portion of the p-type semiconductor surface of the semiconductor substrate.

Referring now to FIG. 4 there is illustrated the structure of FIG. 3 after forming an aluminum layer 18 on the exposed portions of the p-type semiconductor surface 13 of the semiconductor substrate 10 within the opened pattern 16 by electrodeposition, i.e., electroplating. As shown, each aluminum layer 18 has vertical edges that are in contract with vertical edges of an adjacent patterned ARC 14'. Also, one of the horizontal surfaces of each aluminum layer 18 is in direct contact with an exposed portion of the p-type semiconductor surface 13 of semiconductor substrate 10.

The aluminum layer 18 that is formed consists essentially of aluminum. Some minor impurities may or may not be introduced into the aluminum layer 18 during the electrodeposition process.

In some embodiments, and prior to the electrodeposition of the aluminum layer 18, the exposed surface(s) of the p-type semiconductor surface 13 of the semiconductor substrate 10 can be cleaned using a conventional cleaning process that is well known to those skilled in the art which is capable of removing surface oxides and other contaminants from the exposed surface(s) of the semiconductor material. For example, a dilute HF solution can be used to clean the exposed p-type semiconductor surface 13 of the semiconductor substrate 10. Next, the cleaned p-type semiconductor surface 13 may be rinsed with deionized water, and thereafter the structure including cleaned portions of the p-type semiconductor surface 13 of the semiconductor substrate 10 is kept in an inert ambient such as, for example, helium, argon, and/or nitrogen.

The electrodeposition method of the present application includes the use of any conventional electroplating apparatus that is well known to those skilled in the art. Electrodeposition, i.e., electroplating, is a plating process in which metal ions in a solution are moved by an electric field to coat an electrode. The process uses electrical current to reduce cations of a desired material from a solution and coat a conductive object with a thin layer of the material, such as a metal. In electrodeposition, i.e., electroplating, the part to be plated is the cathode of the circuit. In the current disclosure, the exposed portions of the p-type semiconductor surface 13 of the semiconductor substrate 10 (i.e., either the front side semiconductor portion if the n-type semiconductor portion is located beneath the p-type semiconductor portion, or the back side semiconductor portion, if the p-type semiconductor portion is located beneath the n-type semiconductor portion) are employed as the cathode of the circuit. The anode that is employed in the electrodeposition process may or may not be made of the same metal as to be plated.

In the present disclosure, the structure shown in FIG. 3 is immersed, completely or in part, in an electroplating bath (e.g., an electrolyte) containing an anode, one or more dissolved aluminum salts (to be further defined here below) and an ionic liquid as well as other ions that permit the flow of electricity. A power supply supplies a direct current to the anode and plating occurs at the cathode (i.e., the exposed surface 13 of the semiconductor substrate 10).

The electroplating bath that can be employed in the present disclosure includes one or more sources of aluminum ions to plate aluminum layer 18. The one or more sources of aluminum ions that can be present in the electroplating bath include aluminum salts. The aluminum salts that can be used include, but are not limited to, aluminum halides, aluminum nitrates aluminum sulfates, aluminum sulfamates, aluminum alkane sulfonates, aluminum alkanol sulfonate, aluminum cyanides, aluminum acetates or aluminum citrates. In one embodiment, aluminum trichloride ($AlCl_3$) is employed as the aluminum salt.

In general, the aluminum salts are included in the electroplating bath such that aluminum ions range in concentrations from 0.01 g/L to 200 g/L, or such as from 0.5 g/L to 150 g/L, or such as from 1 g/L to 100 g/L, or such as from 5 g/L to 50 g/L. Typically, aluminum salts are included in amounts such that metal ion concentrations range from 0.01 to 100 g/L, more typically from 0.1 g/L to 60 g/L.

Electroplating aluminum from aqueous baths is not feasible and thus aqueous baths are not employed in the present disclosure in the electrodeposition process. Instead, the electroplating bath employed in the present disclosure also includes a non-aqueous ionic liquid. The term "ionic liquid" as used throughout the present disclosure denotes salts that are molten at room temperature (i.e., 10° C.-40° C.).

Examples of ionic liquids that can be employed in the present disclosure in the electroplating bath include, but are not limited to, salts comprised of cationic species, such as alkylimidazolium, alkylpyridinium, alkylpyrrolidinium, phosphonium, and ammonium compounds, associated with anionic species, such as borate, halide, sulfate, acetate, phosphate, and sulfonate compounds. In one embodiment, the anionic species of the ionic liquid can be tetrafluoroborate, hexafluorophosphate, or fluorosulfonate. Some examples of various types of ionic liquids that can be employed in the present disclosure include, but are not limited to, alkylimidazolium chloride, alkylimidazolium tetrafluoroborate. In one embodiment, 1-ethyl-3-methylimadozoline chloride (EMImCl) can be employed as the ionic liquid.

In one embodiment of the present disclosure, the ionic liquid is present in the electroplating bath in an amount from 5 g/L to 5000 g/L. In another embodiment of the present disclosure, the ionic liquid is present in the electroplating bath in an amount from 50 g/L to 500 g/L.

The electroplating bath that can be used may include one or more conventional electroplating bath additives. Such additives include, but are not limited to, one or more of brighteners, suppressors, surfactants, inorganic acids, organic acids, brightener breakdown inhibition compounds, alkali metal salts, and pH adjusting compounds.

Alkali metal salts which may be included in the electroplating bath include, but are not limited to, sodium and potassium salts of halogens, such as chloride, fluoride and bromide. Typically chloride is used. Such alkali metal salts are used in conventional amounts.

The electroplating baths are typically maintained in a temperature range of from 5° C. to 110° C., with a temperature from 20° C. to 80° C. being more typical. Plating temperatures may vary depending on the metal to be plated.

The electrodeposition process employed in forming the aluminum layer 18 uses current waveforms that are well known to those skilled in the art. In one embodiment, the current waveform can include a high current density initially, and after a predetermined period of time, the current density can be decreased to a lower current density. In another embodiment, the current waveform can include a low current density initially, and after a predetermined period of time, the current density can be increased to a higher current density. In yet another embodiment, a single waveform can be employed to plate the aluminum layer 18.

By "low current density" it is meant a plating density within a range from 1 mAmps/$cm^2$ to 20 mAmps/$cm^2$. By "high current density" it is meant a plating density of greater than 20 mAmps/$cm^2$ (a general range for the high current density regime is from greater than 20 mAmps/$cm^2$ to 200 mAmps/$cm^2$. The increase from the low current density regime to the high current density regime or decrease from the high current density regime to the low current density regime may include a continuous ramp or it may include various ramp and soak cycles including a sequence of constant current plateaus.

In some embodiments of the present disclosure, light illumination can be used to increase aluminum nucleation and growth during the electrodeposition process. In particular, light illumination can be used in embodiments in which solar or photovoltaic cells are to be fabricated to generate free electrons that can be used during the electrodeposition process. When light illumination is employed during the electrodeposition process, any conventional light source can be used. The intensity of the light employed may vary and is typically greater than 50 W/m², with an intensity of light from 100 W/m² to 500 W/m² being more typical. The combination of the aforementioned waveform and light illumination enables one to provide complete coverage of an aluminum film on the surface of a semiconductor substrate used in solar cell applications.

The thickness of the aluminum layer 18 that is electrodeposited may vary depending on the type of aluminum source being electrodeposited, the type of electroplating bath employed as well as the duration of the electrodeposition process itself. Typically, the aluminum layer 18 that is formed has a thickness from 0.1 to 20 micrometers, with a thickness from 0.5 to 10 micrometers being more typical.

In one embodiment and as shown in the drawings, the other horizontal surface of the aluminum layer 18 that is not in direct contact with an exposed portion of the p-type semiconductor surface 13 is coplanar with an exposed surface of each of the patterned ARCs 14'. In another embodiment (not shown in the drawings), the other horizontal surface of the aluminum layer 18 that is not in direct contact with an exposed portion of the p-type semiconductor surface 13 is vertically offset (either above or below) from the exposed surface of each patterned ARC 14'.

In some embodiments of the present disclosure, the aluminum layer 18 that is formed by electrodeposition can be cleaned to remove any contaminates from the upper surface of the aluminum layer 18. In one embodiment, the aluminum layer 18 that is formed by electrodeposition can be cleaned by contacting the same with isopropyl alcohol (IPA). After IPA contact, the aluminum layer 18 can be rinsed with deionized water and, if desired, a second contact with IPA can be performed.

In one embodiment of the present disclosure, the aluminum layer 18 has a purity of 1 ppm or greater. In another embodiment of the present disclosure, the aluminum layer 18 has a purity of 10 ppm or greater.

Figure 5:
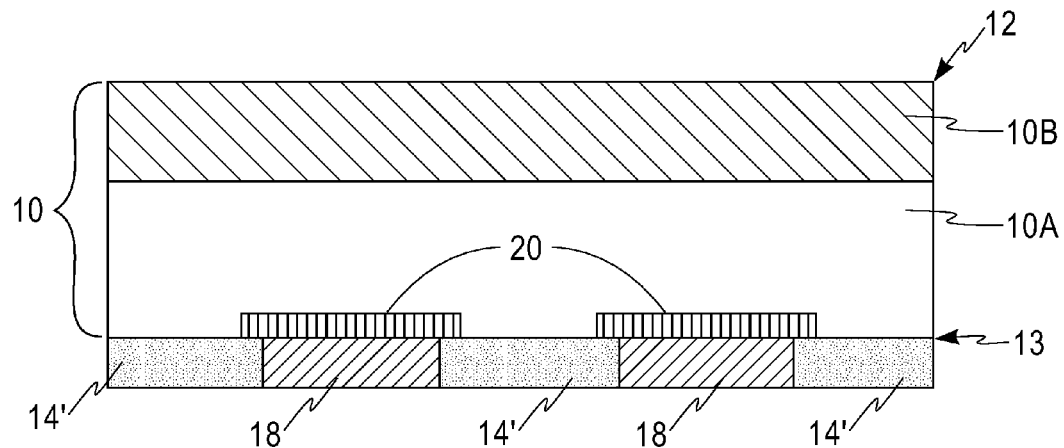
FIG. 5 is a pictorial representation (through a cross sectional view) illustrating the structure of FIG. 4 after forming an aluminum back surface field in the p-type semiconductor under the exposed portion of the p-type semiconductor surface of the semiconductor substrate.

Referring now to FIG. 5, there is illustrated the structure of FIG. 4 after forming a highly doped p-type semiconductor region 20 in the p-type semiconductor portion 10A under the exposed portion 16 of the patterned ARC 14' on the p-type semiconductor surface 13 of the semiconductor substrate 10. The term "highly doped" when referring to the highly doped p-type semiconductor region 20 denotes a p-type dopant concentration of 1e17 atoms/cm³ or greater, with a p-type dopant concentration of from 1e18 atoms/cm³ to 1e22 atoms/cm³ being more typical. In one embodiment, the highly doped p-type semiconductor region 20 comprises aluminum doped silicon.

This highly doped p-type semiconductor region 20 can be formed by a thermal treatment of the structure shown in FIG. 4. The treatment is performed at temperature of 700° C. or above, and more typically, at 800° C. or above. The treatment can be performed in an ambient of oxygen, nitrogen, forming gas, helium, or air, and more typically in air or oxygen. The thickness of the highly doped p-type semiconductor region 20 is typically from 1 micrometer to 20 micrometers, and more typically from 3 micrometers to 10 micrometers. In other embodiment, the formation of the highly doped p-type semiconductor region 20 can be formed by laser treatment.

Figure 6A:
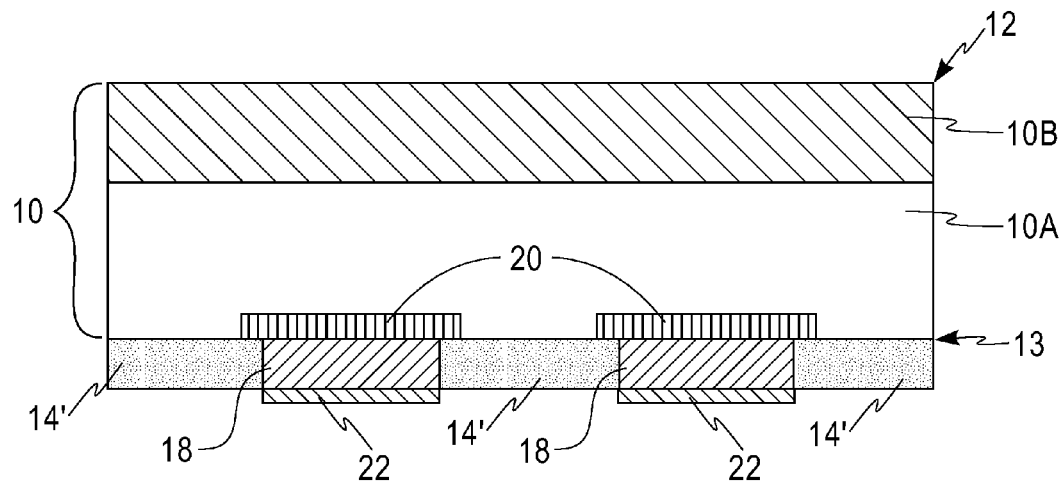
FIGS. 6A, 6B and 6C are pictorial representations (through cross sectional views) illustrating the structure of FIG. 5 after forming a metal layer on the aluminum layer.
Figure 6B:
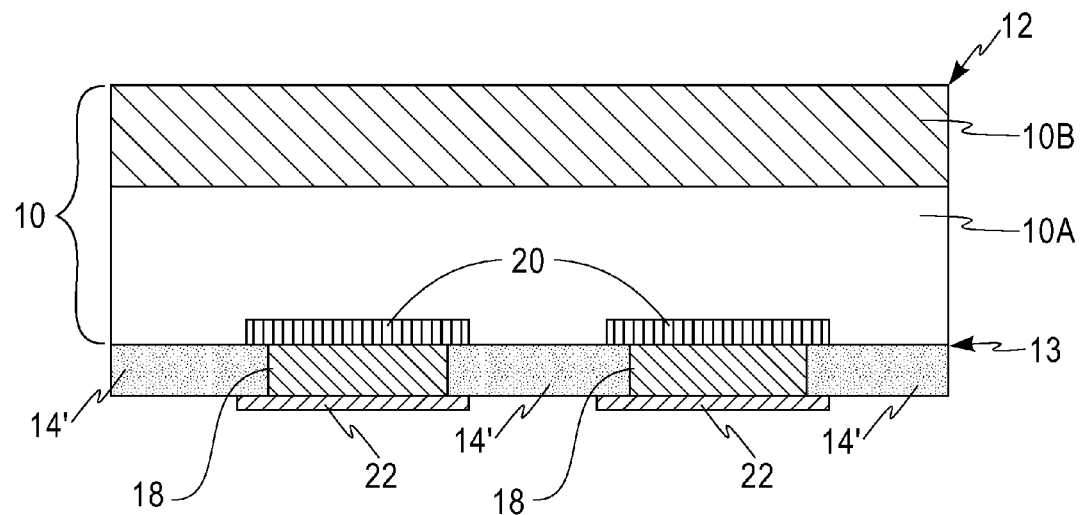
Figure 6C:
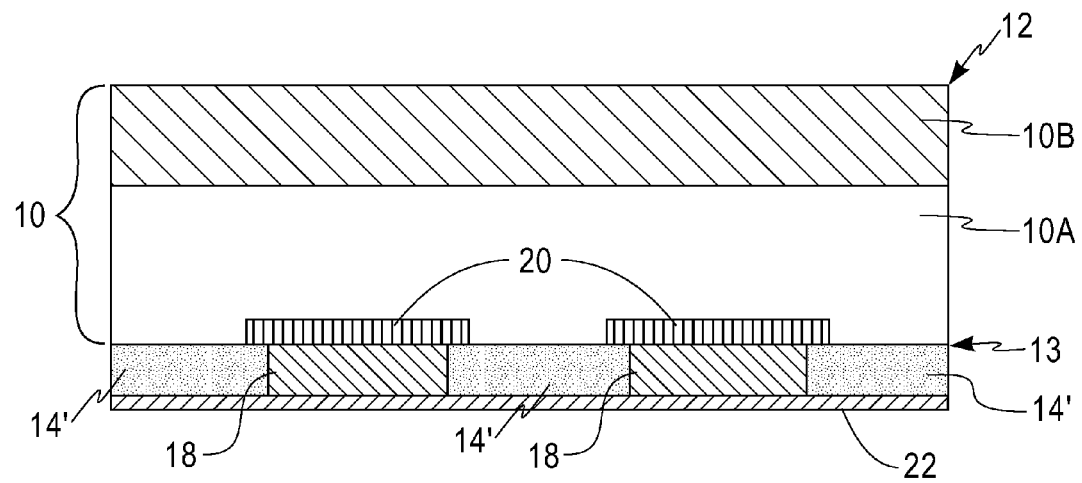

In one embodiment of the present disclosure and as shown in FIGS. 6A, 6B and 6C, one or more metal layers 22 can be deposited on the aluminum layer 18. The one or more metal layers 22 are optional. The materials of the one or more metal layers 22 include, but are not limited to, Cu, Ni, Co, Fe, Mo, Cr, Ti, Ta, Au, Al, In, Ga, Ag, Pt, Pd, Rh, and the alloys thereof. The one or more metal layers 22 that can be formed on the aluminum layer 18 can be formed by any conventional electrodeposition process. The one or more metal layers 22 are in electrical contact with the aluminum layer 18. In one embodiment, and as shown in FIG. 6A, the one or more metal layers 22 do not cover the patterned ARCs 14'. In another embodiment and as shown in FIG. 6B, the one or more metal layers 22 partially cover the patterned ARCs 14'. In a further embodiment and as shown in FIG. 6C the one or more metal layers 22 completely cover the patterned ARCs 14'.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

The invention claimed is:

1. A photovoltaic device comprising:
   a semiconductor substrate including a p-n junction with a p-type semiconductor portion and an n-type semiconductor portion one on top of the other;
   a plurality of patterned antireflective coating layers located on a p-type semiconductor surface of the semiconductor substrate, wherein at least one portion of the p-type semiconductor surface of the semiconductor substrate is exposed;
   an aluminum layer located on at least one portion of the p-type semiconductor surface of the semiconductor surface that is exposed; and
   one or more metal layers in direct physical contact with a portion of said plurality of said patterned antireflective coating layers and in direct physical contact with an entire surface of said aluminum layer, wherein at least one portion of said plurality of said patterned antireflective coating layers are exposed.

2. The photovoltaic device of claim 1, wherein said semiconductor substrate comprises silicon.

3. The photovoltaic device of claim 1, wherein one of said p-type semiconductor portion or said n-type semiconductor portion of said semiconductor substrate has a textured surface.

4. The photovoltaic device of claim 1, wherein each patterned antireflective coating layer of said plurality of patterned antireflective coating layers comprises silicon nitride.

5. The photovoltaic device of claim 1, wherein said at least one portion of the p-type semiconductor surface of the semiconductor substrate that is exposed provides a grid pattern on said p-type semiconductor surface of the semiconductor substrate.

6. The photovoltaic device of claim 1, wherein said photovoltaic devices further comprises a highly doped p-type semiconductor region between said aluminum layer and at least one portion of a p-type semiconductor surface of the semiconductor substrate that is exposed.

7. The photovoltaic device of claim 1, wherein said one or more metal layers comprises Cu, Ni, Co, Fe, Mo, Cr, Ti, Ta, Au, Al, In, Ga, Ag, Pt, Pd, Rh, or alloys thereof.

* * * * *